United States Patent
Lu et al.

(10) Patent No.: US 11,785,776 B2
(45) Date of Patent: Oct. 10, 2023

(54) THROUGH ARRAY CONTACT STRUCTURE OF THREE-DIMENSIONAL MEMORY DEVICE

(71) Applicant: Yangtze Memory Technologies Co., Ltd., Hubei (CN)

(72) Inventors: Zhenyu Lu, Hubei (CN); Wenguang Shi, Hubei (CN); Guanping Wu, Hubei (CN); Xianjin Wan, Hubei (CN); Baoyou Chen, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 0 days.

(21) Appl. No.: 17/944,490

(22) Filed: Sep. 14, 2022

(65) Prior Publication Data
US 2023/0005950 A1  Jan. 5, 2023

Related U.S. Application Data

(63) Continuation of application No. 17/142,373, filed on Jan. 6, 2021, now Pat. No. 11,545,505, which is a
(Continued)

(30) Foreign Application Priority Data

Mar. 8, 2017 (CN) .......................... 201710135329.2
Mar. 8, 2017 (CN) .......................... 201710135654.9

(51) Int. Cl.
*H10B 43/50* (2023.01)
*H10B 43/10* (2023.01)
(Continued)

(52) U.S. Cl.
CPC .......... *H10B 43/50* (2023.02); *H01L 23/5226* (2013.01); *H01L 23/535* (2013.01);
(Continued)

(58) Field of Classification Search
CPC ........ H10B 43/10; H10B 43/20; H10B 43/27; H10B 43/35; H10B 43/40; H10B 43/50;
(Continued)

(56) References Cited

U.S. PATENT DOCUMENTS 8,927,366 B2   1/2015  Lee et al.
8,946,665 B2   2/2015  Shim et al.
(Continued)

FOREIGN PATENT DOCUMENTS

CN   101162721 A   4/2008
CN   103117282 A   5/2013
(Continued)

OTHER PUBLICATIONS

International Search Report and Written Opinion of the International Searching Authority directed to related International Patent Application No. PCT/CN2018/077719, dated Jun. 4, 2018; 8 pages.
(Continued)

*Primary Examiner* — Calvin Y Choi
(74) *Attorney, Agent, or Firm* — Sterne, Kessler, Goldstein & Fox P.L.L.C.

(57) ABSTRACT

Embodiments of through array contact structures of a 3D memory device is disclosed. The 3D NAND memory device includes an alternating layer stack disposed on a substrate. The alternating layer stack includes a first region including an alternating dielectric stack, and a second region including an alternating conductor/dielectric stack. The memory device further comprises a barrier structure extending vertically through the alternating layer stack to laterally separate the first region from the second region, and multiple through array contacts in the first region each extending vertically through the alternating dielectric stack. At least one through array contact is electrically connected with a peripheral circuit.

20 Claims, 10 Drawing Sheets

Related U.S. Application Data continuation of application No. 16/727,491, filed on Dec. 26, 2019, now Pat. No. 10,910,397, which is a continuation of application No. 16/046,843, filed on Jul. 26, 2018, now Pat. No. 10,553,604, which is a continuation of application No. PCT/CN2018/077719, filed on Mar. 1, 2018.

(51) Int. Cl.
    *H10B 43/27*     (2023.01)
    *H10B 43/40*     (2023.01)
    *H01L 23/522*     (2006.01)
    *H01L 23/535*     (2006.01)
    *H10B 43/35*     (2023.01)

(52) U.S. Cl.
    CPC ............ *H10B 43/10* (2023.02); *H10B 43/27* (2023.02); *H10B 43/40* (2023.02); *H10B 43/35* (2023.02)

(58) Field of Classification Search
    CPC ........ H10B 41/10; H10B 41/20; H10B 41/27; H01L 23/5226; H01L 23/535
    USPC ......................................................... 257/326
    See application file for complete search history.

(56) References Cited

U.S. PATENT DOCUMENTS

| | | |
|---|---|---|
| 9,230,974 B1 | 1/2016 | Pachamuthu et al. |
| 9,331,090 B2 | 5/2016 | Alsmeier et al. |
| 9,356,036 B2 | 5/2016 | Lee |
| 9,397,046 B1 | 7/2016 | Sharangpani et al. |
| 9,401,371 B1 | 7/2016 | Lee et al. |
| 9,576,967 B1 | 2/2017 | Kimura et al. |
| 10,074,664 B2 | 9/2018 | Eom |
| 10,553,604 B2 | 2/2020 | Lu et al. |
| 10,910,397 B2 | 2/2021 | Lu et al. |
| 2008/0087932 A1 | 4/2008 | Son et al. |
| 2013/0009229 A1 | 1/2013 | Lee et al. |
| 2013/0100722 A1 | 4/2013 | Shin |
| 2013/0126957 A1 | 5/2013 | Higashitani et al. |
| 2013/0130468 A1 | 5/2013 | Higashitani et al. |
| 2014/0061748 A1 | 3/2014 | Lee |
| 2014/0138765 A1 | 5/2014 | Lee et al. |
| 2015/0236038 A1 | 8/2015 | Pachamuthu et al. |
| 2015/0372101 A1 | 12/2015 | Lee et al. |
| 2016/0064281 A1 | 3/2016 | Izumi et al. |
| 2016/0071741 A1 | 3/2016 | Imamura et al. |
| 2016/0079252 A1 | 3/2016 | Yamashita |
| 2016/0141419 A1 | 5/2016 | Baenninger et al. |
| 2016/0163732 A1 | 6/2016 | Lim et al. |
| 2016/0225714 A1 | 8/2016 | Yun et al. |
| 2016/0322381 A1 | 11/2016 | Liu et al. |
| 2016/0336340 A1 | 11/2016 | Song et al. |
| 2016/0351581 A1 | 12/2016 | Ahn |
| 2017/0025421 A1* | 1/2017 | Sakakibara ............ H10B 41/27 |
| 2017/0040337 A1 | 2/2017 | Kim et al. |
| 2017/0062462 A1 | 3/2017 | Lee |
| 2017/0236746 A1* | 8/2017 | Yu .......................... H10B 43/40 257/314 |
| 2019/0043879 A1 | 2/2019 | Lu et al. |
| 2020/0152653 A1 | 5/2020 | Lu et al. |
| 2021/0126005 A1 | 4/2021 | Lu et al. |

FOREIGN PATENT DOCUMENTS

| | | |
|---|---|---|
| CN | 103545276 A | 1/2014 |
| CN | 103680611 A | 3/2014 |
| CN | 103681684 A | 3/2014 |
| CN | 104051467 A | 9/2014 |
| CN | 104205342 A | 12/2014 |
| CN | 104269407 A | 1/2015 |
| CN | 104979351 A | 10/2015 |
| CN | 106206593 A | 12/2016 |
| CN | 106486487 A | 3/2017 |
| CN | 106920794 A | 7/2017 |
| CN | 107068687 A | 8/2017 |
| JP | 2016-058552 A | 4/2016 |
| KR | 2013-0039123 A | 4/2013 |
| WO | WO 2017/112014 A1 | 6/2017 |

OTHER PUBLICATIONS

Chinese Office Action directed to related Chinese Patent Application No. PCT/CN2018/077719 with attached English-language translation, dated Oct. 14, 2019; 10 pages.

Japanese Application No. 2019-570606, Office Action dated Nov. 16, 2020; English Translation from EPO Global Dossier, 18 pages.

Office Action filed in application No. 18763685.7, dated Oct. 16, 2020; 9 pages.

\* cited by examiner

THROUGH ARRAY CONTACT STRUCTURE OF THREE-DIMENSIONAL MEMORY DEVICE

CROSS-REFERENCE TO RELATED APPLICATIONS

This application is a continuation application of U.S. patent application Ser. No. 17/142,373 filed on Jan. 6, 2021 and now U.S. Pat. No. 11,545,505 issued on Jan. 3, 2023, which is a continuation application of U.S. patent application Ser. No. 16/727,491 filed on Dec. 26, 2019 and now U.S. Pat. No. 10,910,397 issued on Feb. 2, 2021, which is a continuation application of U.S. patent application Ser. No. 16/046,843 filed on Jul. 26, 2018 and now U.S. Pat. No. 10,553,604 issued on Feb. 4, 2020, which is a continuation application of International Patent Application No. PCT/CN2018/077719 filed on Mar. 1, 2018, which claims priority to Chinese Patent Application No. 201710135654.9 filed on Mar. 8, 2017 and Chinese Patent Application No. 201710135329.2 filed on Mar. 8, 2017, the entire contents of which are incorporated herein by reference.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

BRIEF SUMMARY

Embodiments of through array contact (TAC) structures of 3D memory devices and fabrication methods thereof are disclosed herein.

Disclosed is a three-dimensional (3D) NAND memory device including an alternating layer stack disposed on a substrate. The alternating layer stack can include a first region including an alternating dielectric stack comprising a plurality of dielectric layer pairs, and a second region including an alternating conductor/dielectric stack comprising a plurality of conductor/dielectric layer pairs. The three-dimensional (3D) NAND memory device further includes a barrier structure extending vertically through the alternating layer stack to laterally separate the first region from the second region, and a plurality of through array contacts in the first region each extending vertically through the alternating dielectric stack. At least one of the plurality of through array contacts is electrically connected with at least one peripheral circuit.

In some embodiments, the barrier structure comprises silicon oxide and silicon nitride. Each of the plurality of dielectric layer pairs comprises a silicon oxide layer and a silicon nitride layer, and each of the plurality of conductor/dielectric layer pairs comprises a metal layer and a silicon oxide layer. A number of the plurality of dielectric layer pairs is at least 32, and a number of the plurality of conductor/dielectric layer pairs is a least 32.

The three-dimensional (3D) NAND memory device further includes a plurality of slit structures each extending vertically through the alternating conductor/dielectric stack and laterally along the word line direction to divide the alternating conductor/dielectric stack into a plurality of memory fingers.

In some embodiments, the barrier structure laterally extends along the word line direction, and the first region is separated by the barrier structure from the second region and sandwiched between two neighboring slit structures.

In some embodiments, the barrier structure laterally extends along a bit line direction that is different than the word line direction to laterally separate the first region from the second region. The bit line direction can be perpendicular to the word line direction.

In some embodiments, a width of the first region enclosed by the barrier structure in the bit line direction is larger than a distance between two neighboring slit structures. The first region enclosed by the barrier structure is sandwiched between two top selective gate staircase regions in the word line direction. At least top two layers of the alternating conductor/dielectric stack in each top selective gate staircase region have a staircase structure.

The three-dimensional (3D) NAND memory device further includes at least one conductive layer on the staircase structure in the top selective gate staircase regions and configured to interconnect top select gates that are above the alternating conductor/dielectric stack in the second region and on both sides of first region enclosed by the barrier structure in the word line direction. At least two first regions enclosed by corresponding barrier structures, each first region extending parallel along the bit line direction.

The three-dimensional (3D) NAND memory device further includes a plurality of barrier structures to enclose a plurality of first regions from the second region, the plurality of first regions are aligned in the bit line direction. Each of the plurality of first regions is sandwiched between two neighboring slit structures in the bit line direction. The plurality of first regions are aligned as at least two columns in the bit line direction. At least one slit structure that is sandwiched by two neighboring barrier structures in the bit line direction includes a gap and configured to interconnect word lines of neighboring memory fingers.

In some embodiments, the first region is separated by the barrier structure from a staircase structure on an edge of the alternating conductor/dielectric layer stack along the bit line direction. An opening of the barrier structure is at an edge of the alternating layer stack along the bit line direction. A width of the first region in the bit line direction is larger than a distance between two neighboring slit structures. A width of the first region in the bit line direction is less than a maximum distance between two neighboring slit structures in the staircase structure on the edge of the alternating layer stack along the bit line direction.

The three-dimensional (3D) NAND memory device further includes a plurality of dummy channel structures adjacent to the barrier structure, each dummy channel structure extending vertically through the alternating conductor/dielectric stack.

Another aspect of the present disclosure provides a method for forming a three-dimensional (3D) NAND memory device, comprising: forming, on a substrate, an alternating dielectric stack comprising a plurality of dielectric layer pairs, each of the plurality of dielectric layer pairs comprising a first dielectric layer and a second dielectric layer different from the first dielectric layer; forming at least one barrier structure each extending vertically through the alternating dielectric stack, wherein the at least one barrier structure separates the alternating dielectric stack into at least one first region enclosed laterally by at least the barrier structure, and a second region; forming a plurality of slits, and replacing, through the slits, first dielectric layers in the second portion of the alternating dielectric stack with conductor layers to form an alternating conductor/dielectric stack comprising a plurality of conductor/dielectric layer pairs; depositing a conductive material into the slits to form a plurality of slit structures; and forming a plurality of through array contacts in the first region, each through array contact extending vertically through the alternating dielectric stack, to electrically connect at least one of the plurality of through array contacts to at least one peripheral circuit.

The method further includes forming the at least one peripheral circuit on a base substrate; forming at least one interconnect structure to electrically connect the at least one of the plurality of through array contacts to the at least one peripheral circuit; and forming an epitaxial substrate above the at least one peripheral circuit. The substrate at least includes the base substrate and the epitaxial substrate.

The method further includes prior to forming the slits, forming a plurality of doped regions in the epitaxial substrate, so as to contact each slit structure with a corresponding doped region; forming at least one opening in the epitaxial substrate corresponding to the at least one first region to expose an interconnect structure to electronically connect with the at least one peripheral circuit; and filling the at least one opening with a dielectric material.

The method further includes forming the plurality of slit structures laterally to extend along a word line direction to divide the alternating conductor/dielectric stack into a plurality of memory fingers.

The method further includes forming two parallel barrier structures laterally to extend along the word line direction, such that the first region is separated by the two parallel barrier structure from the second region and sandwiched between two neighboring slit structures.

The method further includes forming the barrier structure laterally extending along a bit line direction that is different than the word line direction to laterally separate the first region from the second region.

The method further includes forming the barrier structure to laterally extend along the bit line direction that is perpendicular to the word line direction.

The method further includes forming the barrier structure such that a width in the bit line direction of the first region enclosed by the barrier structure is larger than a distance between two neighboring slit structures.

The method further includes forming a staircase structure in the alternating dielectric stack adjacent to the barrier structure.

The method further includes forming at least one conductive layer on the staircase structure adjacent to the barrier structure to interconnect top select gates that are above the alternating conductor/dielectric stack in the second region, and on both sides of first region enclosed by the barrier structure in the word line direction.

The method further includes forming at least two barrier structures to enclose at least two first regions extending parallel along the bit line direction.

The method further includes forming a plurality of barrier structures to enclose a plurality of first regions from the second region, the plurality of first regions are aligned in the bit line direction, such that each of the plurality of first regions is sandwiched between two neighboring slit structures in the bit line direction.

The method further includes forming the plurality of barrier structures such that the plurality of first regions enclosed by the plurality of barrier structures are aligned as at least two columns in the bit line direction.

The method further includes forming a gap in the at least one slit structure that is sandwiched by two neighboring barrier structures in the bit line direction to for interconnect word lines of neighboring memory fingers.

The method further includes forming the barrier structure to separate the first region in the staircase structure at the edge of the alternating stack, wherein an opening of the barrier structure is at the edge of the alternating layer stack along a bit line direction that is different than the word line direction.

The method further includes forming the barrier structure, such that a width of the first region in the bit line direction is larger than a distance between two neighboring slit structures.

The method further includes forming the barrier structure, such that a width of the first region in the bit line direction is less than a maximum distance between two neighboring slit structures in the staircase structure.

The method further includes forming a plurality of dummy channel structures adjacent to the barrier structure, each dummy channel structure extending vertically through the alternating conductor/dielectric stack.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
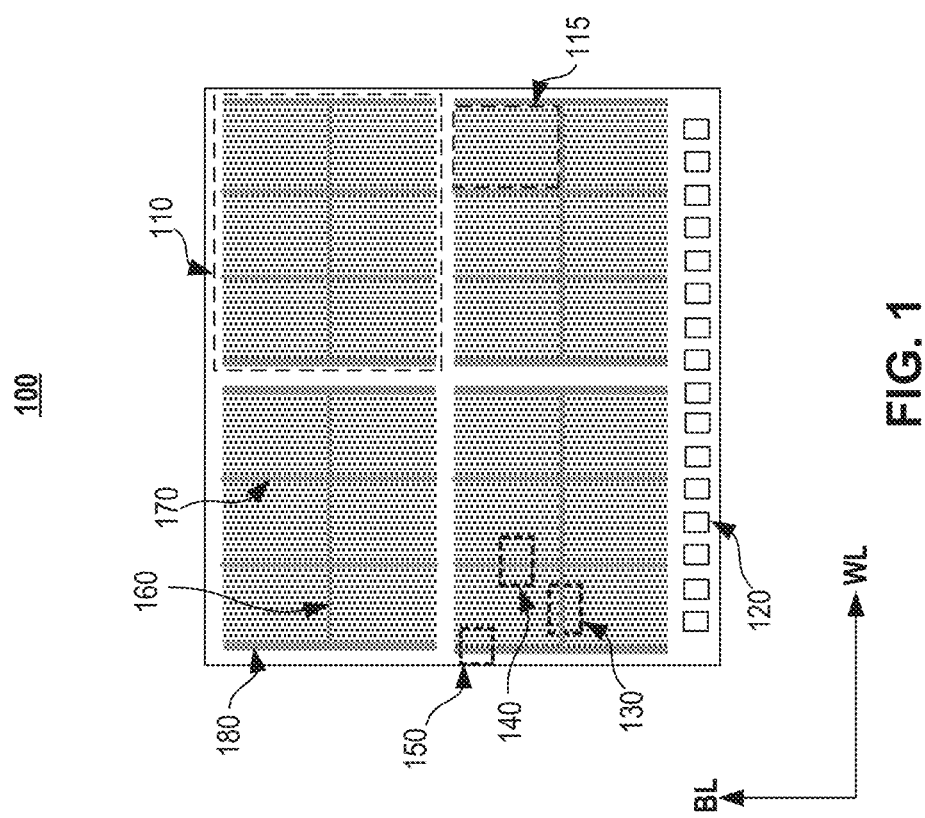
FIG. 1 illustrates a schematic diagram of an exemplary 3D memory device in a plan view, according to some embodiments of the present disclosure.

Embodiments of the present disclosure will be described with reference to the accompanying drawings.

DETAILED DESCRIPTION

Detailed Description

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context.

For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically-oriented strings of memory cell transistors (i.e., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

Various embodiments in accordance with the present disclosure provide a 3D memory device with through array contact (TAC) structures for a memory array (also referred to herein as an "array device"). The TAC structures allow contacts between the memory and various peripheral circuits and/or peripheral devices (e.g., page buffers, latches, decoders, etc.) to be fabricated in a limited number of steps (e.g., in a single step or in two steps), thereby reducing the process complexity and manufacturing cost. The disclosed TACs are formed through a stack of alternating dielectric layers, which can be more easily etched to form through holes therein compared with a stack of alternating conductor and dielectric layers.

The TACs can provide vertical interconnects between the stacked array device and peripheral device (e.g., for power bus and metal routing), thereby reducing metal levels and shrinking die size. In some embodiments, the TACs can be interconnected with various lines in a top conductor layer and/or a bottom conductor layer, which are suitable for those 3D memory architectures in which the array device and the peripheral device formed on different substrates are formed sequentially or joined by hybrid bonding in a face-to-face manner. In some embodiments, the TACs in the through array contact structures disclosed herein are formed through a stack of alternating dielectric layers, which can be more easily etched to form through holes therein compared with a stack of alternating conductor and dielectric layers, thereby reducing the process complexity and manufacturing cost.

FIG. 1 illustrates a schematic diagram of an exemplary 3D memory device 100 in the plan view, according to some embodiments of the present disclosure. 3D memory device 100 can include a plurality of channel structure regions (e.g., memory planes, memory blocks, memory fingers, etc., which are described in detail in connection with various figures below), while one or more TAC structures can be formed between two neighboring channel structure regions.

As shown in FIG. 1, 3D memory device 100 can include four or more memory planes 110, each of which can include a plurality of memory blocks 115. It is noted that, the arrangement of memory planes 110 in 3D memory device 100 and the arrangement of memory blocks 115 in each memory plane 100 illustrated in FIG. 1 are only used as an example, which is not limit the scope of the present disclosure.

TAC structures can include one or more bit line (BL) TAC regions 160 that are sandwiched by two neighboring memory blocks 115 in the bit line direction of the 3D memory device (labeled as "BL" in figures) and extended along the word line direction of the 3D memory device (labeled as "WL" in figures), one or more word line (BL) TAC regions 160 that are sandwiched by two neighboring memory blocks 115 in the word line direction (WL) and extended along the bit line direction (BL), and one or more staircase structure (SS) TAC regions 180 that are located at the edges of each memory plane 110.

In some embodiments, 3D memory device 100 can include a plurality of contact pads 120 arranged in a line at an edge of the 3D memory device 100. Interconnect contact can be used for electrically interconnect 3D memory device 100 to any suitable device and/or interface that provide driving power, receive control signal, transmit response signal, etc.

Figure 2:
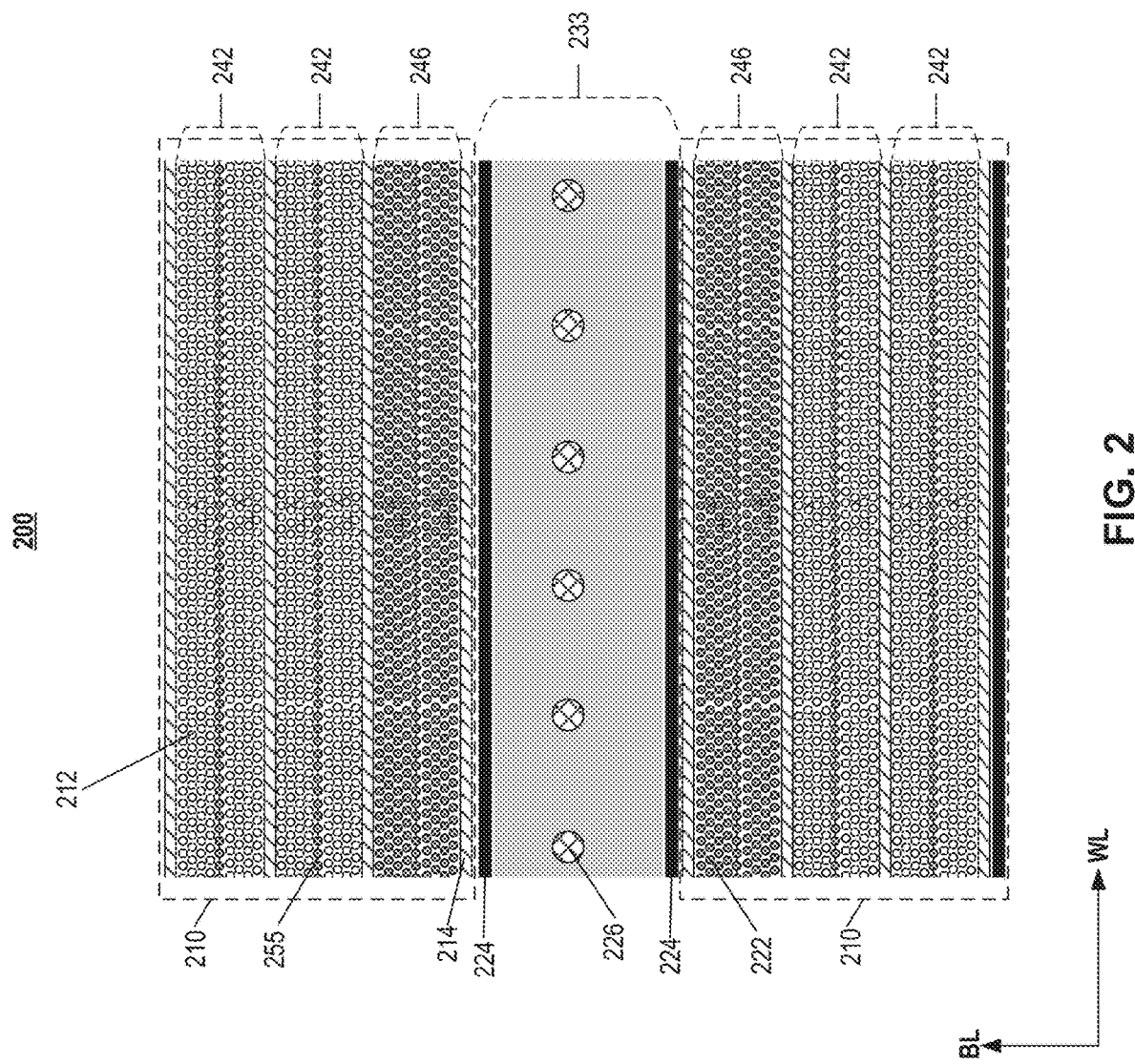
FIG. 2 illustrates a schematic enlarged plan view of a region of 3D memory device including an exemplary bit line through array contact region, according to some embodiments of the present disclosure.

FIG. 2 depicts an enlarged plan view of the region 130 shown in FIG. 1 including an exemplary bit line (BL) TAC region 160 of the 3D memory device. FIGS. 3A-3D depict enlarged plan views of the region 140 shown in FIG. 1 including various exemplary word line (WL) TAC regions 170 of the 3D memory device. FIGS. 4A and 4B depict enlarged plan views of the region 150 shown in FIG. 1 including various exemplary staircase structure (SS) TAC regions 180 of the 3D memory device.

Referring to FIG. 2, an enlarged plan view of the region 130 shown in FIG. 1 including an exemplary bit line (BL) TAC region of the 3D memory device is illustrated according to some embodiments of the present disclosure. The region 200 of the 3D memory device (i.e., region 130 as shown in FIG. 1) can include two channel structure regions 210 (e.g., neighboring memory blocks 115 in BL direction) and a bit line (BL) TAC region 233 (e.g., BL TAC region 160 as shown in FIG. 1).

Channel structure regions 210 can include an array of channel structures 212, each is part of a NAND string including a plurality of stacked memory cells. Channel structures 212 extend through a plurality of conductor layer and dielectric layer pairs that are arranged along a direction that is perpendicular to the plan view, which is also referred as a direction that is perpendicular to the surface of the substrate of the 3D memory device, and/or a "vertical direction" (which is illustrated in a cross-sectional view in connection with FIG. 5 described in detail below).

The plurality of conductor/dielectric layer pairs are also referred to herein as an "alternating conductor/dielectric stack." The number of the conductor/dielectric layer pairs in alternating conductor/dielectric stack (e.g., 32, 64, or 96) can set the number of memory cells in 3D memory device 100. Conductor layers and dielectric layers in alternating conductor/dielectric stack alternate in the vertical direction. In other words, except the ones at the top or bottom of alternating conductor/dielectric stack, each conductor layer can be adjoined by two dielectric layers on both sides, and each dielectric layer can be adjoined by two conductor layers on both sides.

Conductor layers can include conductive materials including, but not limited to, tungsten (W), cobalt (Co), copper (Cu), aluminum (Al), polycrystalline silicon (polysilicon), doped silicon, silicides, or any combination thereof. Dielectric layers can include dielectric materials including, but not limited to, silicon oxide, silicon nitride, silicon oxynitride, or any combination thereof. In some embodiments, conductor layers include metal layers, such as W, and dielectric layers include silicon oxide.

In some embodiments, BL TAC region 233 can be sandwiched by two neighboring channel structure regions 210 in BL direction, and can extend in WL direction. TAC region 233 can be defined by a barrier structure 224 in conjunction with the edges of BL TAC region 233 of the 3D memory device. Multiple TACs 226 can be formed in BL TAC region 233, which is enclosed laterally by barrier structure 224 and the edges of BL TAC region 233. In some embodiments, multiple TACs 226 in BL TAC region 233 can penetrate an alternating dielectric stack for switch routing and for reducing bit line capacitance.

The alternating dielectric stack can include a plurality of dielectric layer pairs that are arranged along the vertical direction that is perpendicular to the surface of the substrate of the 3D memory device (which is illustrated in a cross-sectional view in connection with FIG. 5 described in detail below). Each dielectric layer pair includes a first dielectric layer and a second dielectric layer that is different from first dielectric layer. In some embodiments, first dielectric layer and second dielectric layer each includes silicon nitride and silicon oxide. First dielectric layers in alternating dielectric stack can be the same as dielectric layers in the alternating conductor/dielectric stack described above. In some embodiments, the number of dielectric layer pairs in the alternating dielectric stack is the same as the number of the conductor/dielectric layer pairs in the alternating conductor/dielectric stack.

As shown in FIG. 2, each channel structure region 210 can include one or more slit structures 214 each extending in WL direction. At least some slit structures 214 can function as the common source contact for an array of channel structures 212 in channel structure regions 210. Slit structures 214 can also divide the 3D memory device into multiple memory fingers 242 and/or dummy memory fingers 246. A top select gate cut 255 can be disposed in the middle of each memory finger 242 to divide the top select gate (TSG) of the memory finger into two portions. The top select gate cut 255 can include dielectric materials including, but not limited to, silicon oxide, silicon nitride, silicon oxynitride, or any combination thereof In some embodiments, dummy channel structures 222 are formed in part of channel structure regions 210, for example, in dummy memory fingers 246 that are adjacent to BL TAC region 233 in BL direction. Dummy channel structures 222 can provide mechanical support for the memory array structures. Dummy memory fingers 246 do not have memory functions, and thus bit lines and related interconnect lines are not formed in dummy memory fingers 246.

Figure 3A:
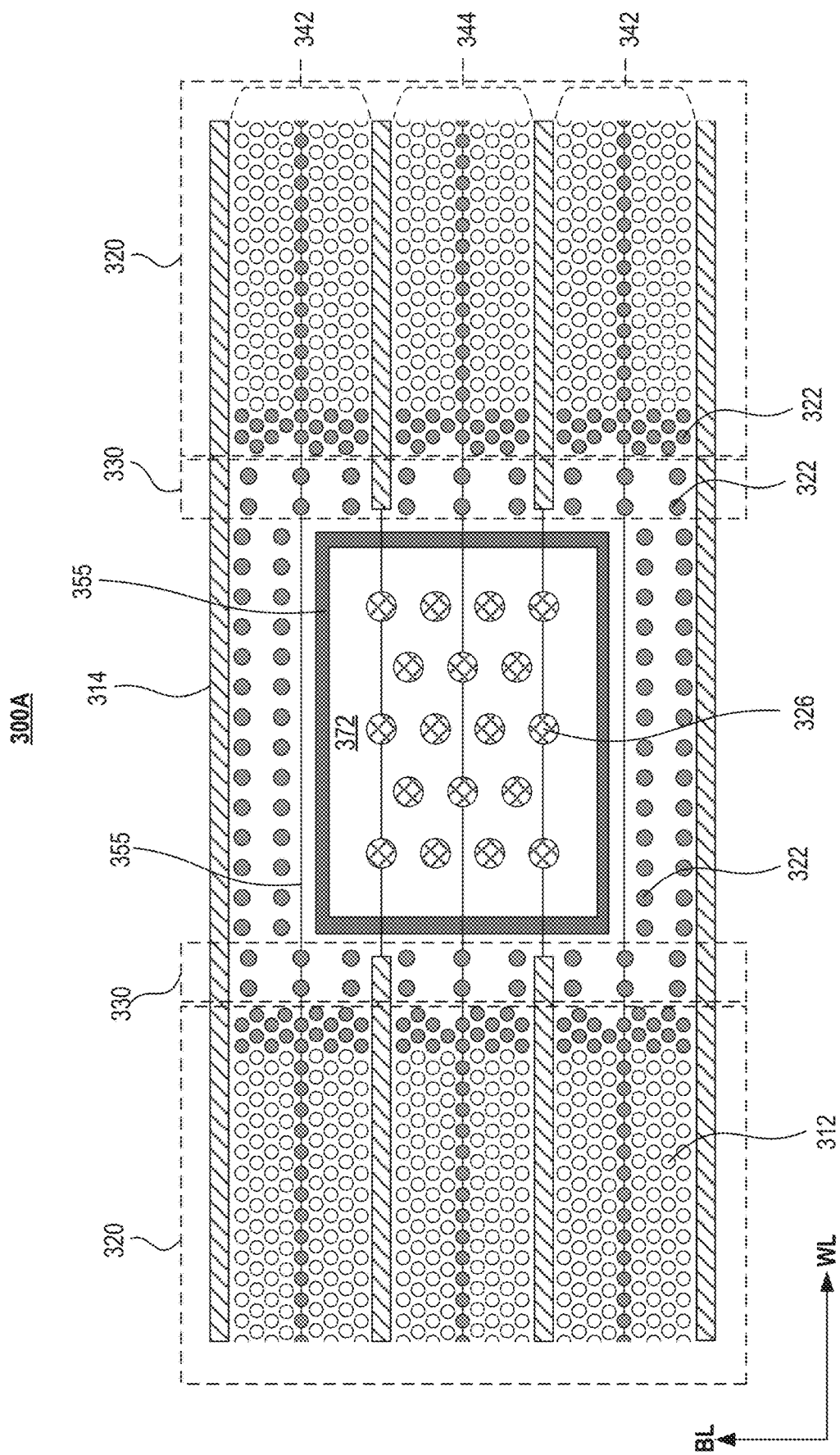
FIGS. 3A-3D illustrate schematic enlarged plan views of a region of 3D memory device including various exemplary word line through array contact regions, according to some embodiments of the present disclosure.
Figure 4A:
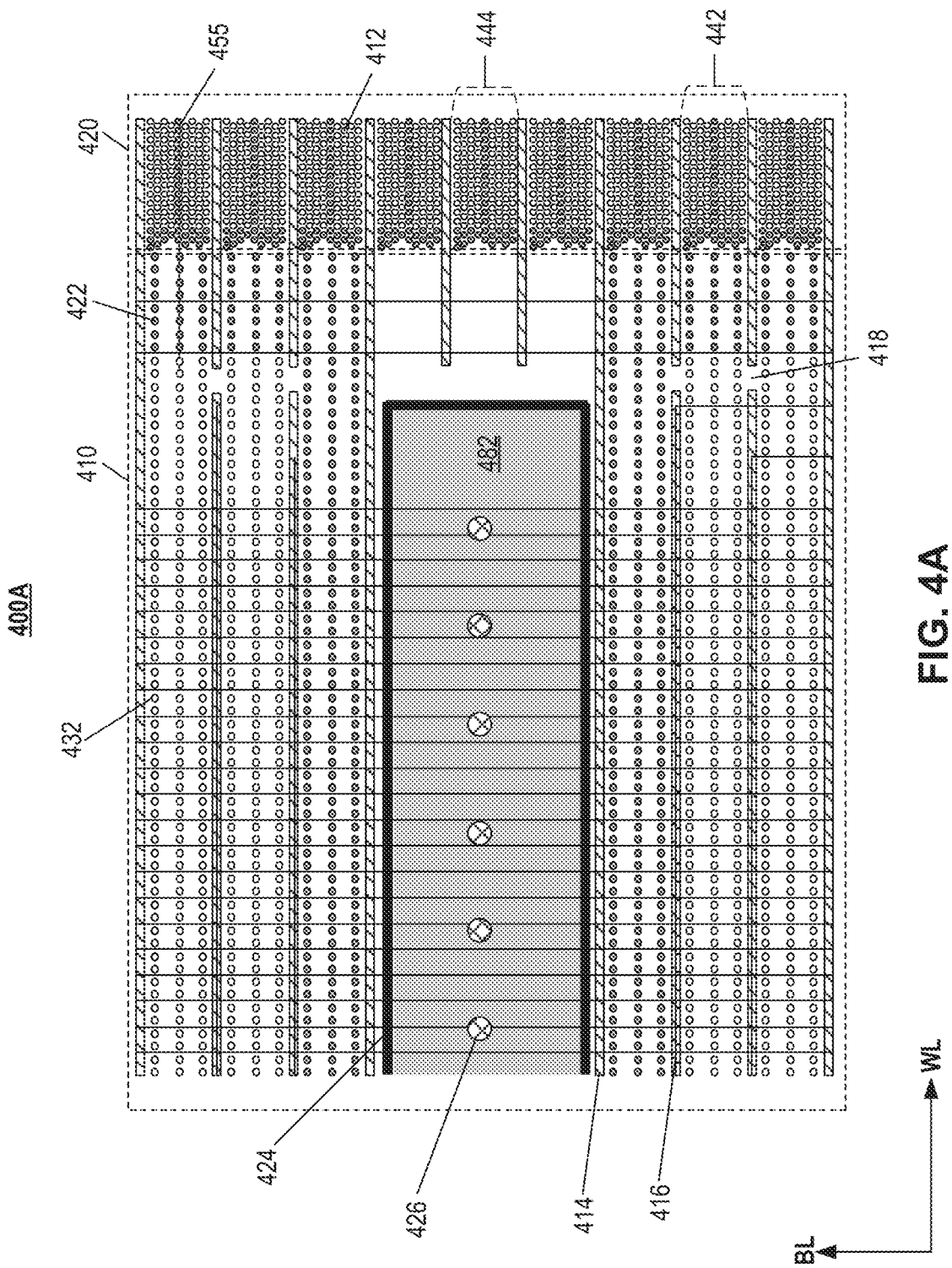
FIGS. 4A-4B illustrate schematic enlarged plan views of a region of 3D memory device including various exemplary staircase structure through array contact regions, according to some embodiments of the present disclosure.
Figure 4B:
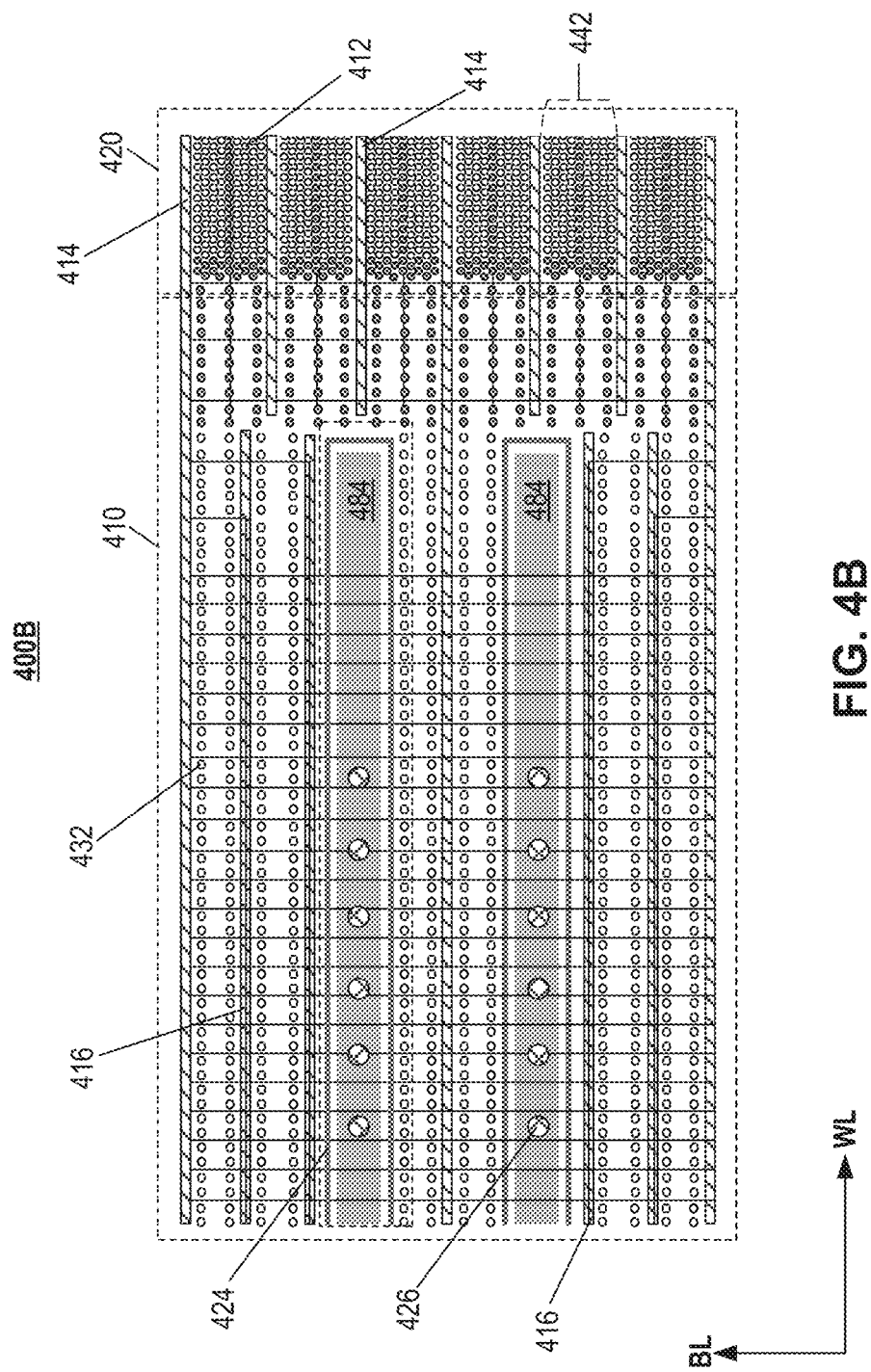

Referring to FIG. 3A, an enlarged plan view of the region 140 shown in FIG. 1 including an exemplary word line (WL) TAC region of the 3D memory device is illustrated according to some embodiments of the present disclosure. The region 300A of the 3D memory device (i.e., region 140 as shown in FIG. 1) can include channel structure regions 320, a word line (WL) TAC region 372 (e.g., WL TAC region 170 as shown in FIG. 1), and top selective gate (TSG) staircase regions 330.

As shown in FIG. 3A, channel structure regions 320 can include an array of channel structures 312, each including a plurality of stacked memory cells. TSG staircase regions 330 can be disposed on the sides of channel structure regions 320 and adjacent to WL TAC region 372 in the plan view. That is, WL TAC region 372 is sandwiched by two TSG staircase regions 330 in WL direction. WL TAC region 372 can be defined by a barrier structure 324. Multiple TACs 326 used for switch routing and for reducing word line capacitance can be formed in WL TAC region 372, which is enclosed laterally by barrier structure 324.

In some embodiments, dummy channel structures 322 are formed outside WL

TAC region 372 to provide mechanical support for the memory array structures. It is understood that dummy channel structures 322 can be formed in any regions outside WL TAC region 372, for example, in TSG staircase regions 330, and along the edges of channel structure regions 320 adjacent to TSG staircase regions 330. It is noted that, channel structures 312 and dummy channel structures 322 penetrate the alternating conductor/dielectric stack, while TACs 326 penetrate the alternating dielectric stack.

In some embodiments, a plurality of slit structures 314 each extending in WL direction can divide the 3D memory device into multiple memory fingers 342, 344. At least some slit structures 314 can function as the common source contact for an array of channel structures 312 in channel structure regions 320. Sidewalls of slit structures 314 can include dielectric materials including, but not limited to, silicon oxide, silicon nitride, silicon oxynitride, or any combination thereof. Filling material of slit structures 314 can include conductive materials including, but not limited to, tungsten (W), cobalt (Co), copper (Cu), aluminum (Al), polycrystalline silicon (polysilicon), doped silicon, silicides, or any combination thereof.

A top select gate cut 355 can be disposed in the middle of each memory finger 342, 344 to divide the top select gate (TSG) of the memory finger into two portions. The top select gate cut 355 can include dielectric materials including, but not limited to, silicon oxide, silicon nitride, silicon oxynitride, or any combination thereof It is noted that, a width of WL TAC region 372 in BL direction can be larger than a width of each memory finger 342 or 344. That is, barrier structure 324 in BL direction can cross at least two neighboring slit structures 314. As such, the conductive layers in channel structure regions 320 in memory finger 344 can be completely blocked by barrier structure 324. Therefore, the top selective gates of channel structures 312 between two channel structure regions 320 in memory finger 344 on both side of WL TAC region 372 are not interconnected by the top conductor layers in the alternating conductor/dielectric stack.

To interconnect the top selective gates of channel structures 312 between two channel structure regions 320 in memory finger 344 on both side of WL TAC region 372, TSG staircase regions 330 can include one or more conductive lines (not shown in FIG. 3A) formed on a staircase structure (e.g., within top two to four levels) for making electrical interconnections with the top selective gates of channel structures 312 between two channel structure regions 320 in memory finger 344 that are separated by WL TAC region 372.

For example, slit structures 314 that are cut off by WL TAC region 372 can extend into TSG staircase regions 330. The top two conductor layers in the alternating conductor/dielectric stack can have a single-side staircase structure. One or more interconnect layers with contacts can be formed on the single-side staircase structure to provide electrical interconnection between the top selective gates of channel structures 312 in channel structure regions 320 and in memory finger 344 that are separated by WL TAC region 372.

Accordingly, by introducing TSG staircase regions 330 that interconnect the top selective gates on both sides of WL TAC region 372, WL TAC region 372 can extend along BL direction to provide an enough size to enclose a desired number of TACS 326. Further, each memory plane 110 as shown in FIG. 1 can include multiple WL TAC regions 372 arranged in WL direction. That is, multiple memory blocks 115 can be arranged in WL direction in each memory plane 110.

Figure 3B:
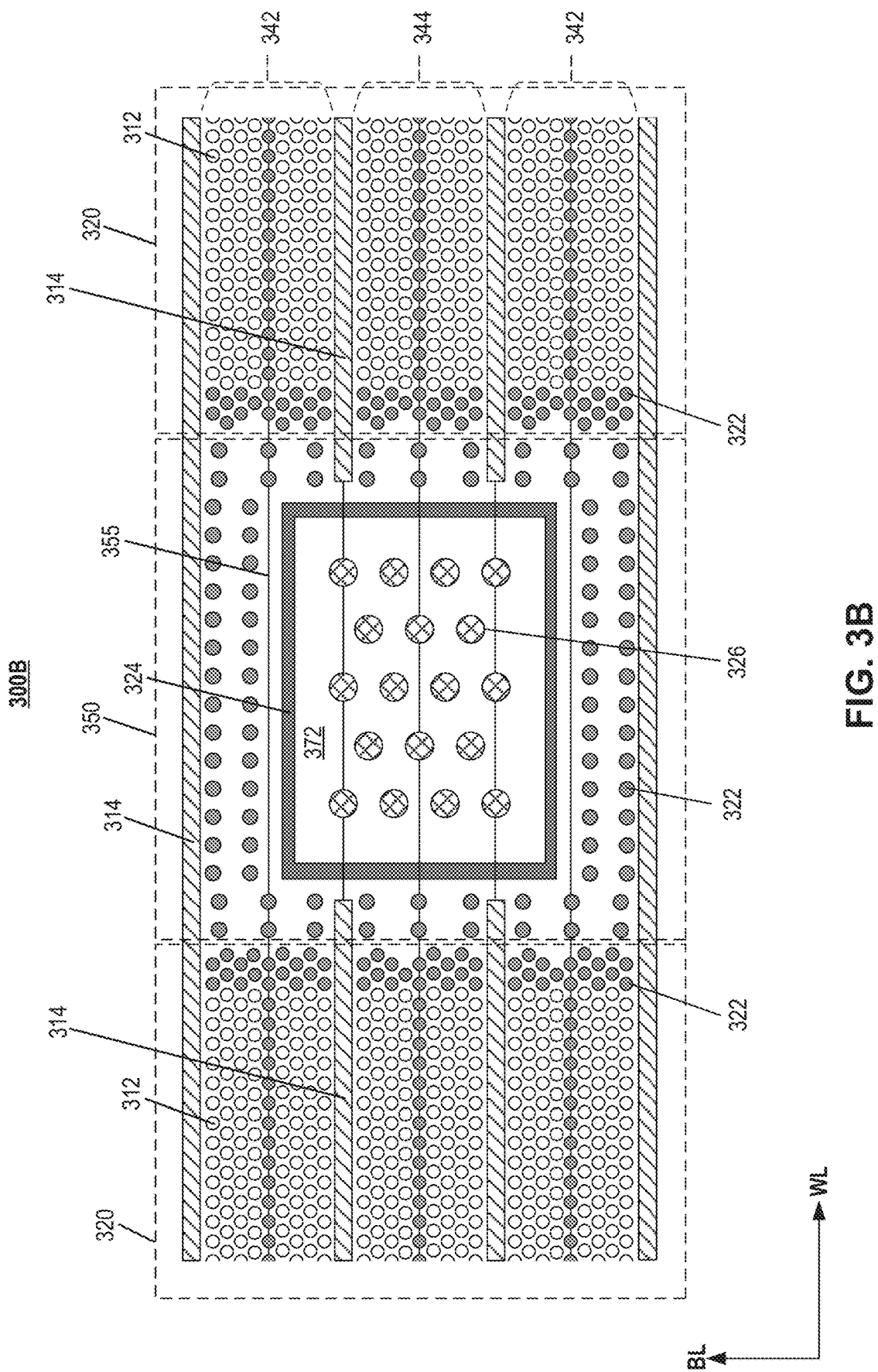

Referring to FIG. 3B, an enlarged plan view of the region 140 shown in FIG. 1 including another exemplary word line (WL) TAC region of the 3D memory device is illustrated according to some alternative embodiments of the present disclosure. The region 300B of the 3D memory device (i.e., region 140 as shown in FIG. 1) can include channel structure regions 320, a dummy channel region 350 that encloses a word line (WL) TAC region 372 (e.g., WL TAC region 170 as shown in FIG. 1).

As shown in FIG. 3B, channel structure regions 320 can include an array of channel structures 312, each including a plurality of stacked memory cells. Dummy channel region 350 is sandwiched by two channel structure regions 320 in WL direction. WL TAC region 372 is enclosed by dummy channel region 350. WL TAC region 372 can be defined by a barrier structure 324. Multiple TACs 326 can be formed in WL TAC region 372, which is enclosed laterally by barrier structure 324.

In some embodiments, dummy channel structures 322 are formed outside WL

TAC region 372 to provide mechanical support for the memory array structures. It is understood that dummy channel structures 322 can be formed in any regions outside WL TAC region 372, for example, in dummy channel region 350, and along the edges of channel structure regions 320 adjacent to dummy channel region 350. It is noted that, channel structures 312 and dummy channel structures 322 penetrate the alternating conductor/dielectric stack, while TACs 326 penetrate the alternating dielectric stack.

In some embodiments, a plurality of slit structures 314 each extending in WL direction can divide the 3D memory device into multiple memory fingers 342, 344. A top select gate cut 355 can be disposed in the middle of each memory finger 342, 344 to divide the top select gate (TSG) of the memory finger into two portions.

It is noted that, a width of WL TAC region 372 in BL direction can be larger than a width of each memory finger 342 or 344. That is, barrier structure 324 in BL direction can cross at least two neighboring slit structures 314. As such, the conductive layers in channel structure regions 320 in memory finger 344 can be completely blocked by barrier structure 324. Therefore, the top selective gates of channel structures 312 between two channel structure regions 320 in memory finger 344 on both side of WL TAC region 372 are not interconnected by the top conductor layers in the alternating conductor/dielectric stack.

Because of that, in some embodiments associated with such design of WL TAC region 372, one memory plane 110 can include only two memory blocks 115 in WL direction. WL TAC region 372 is sandwiched by the two memory blocks (i.e., channel structure regions 320 as shown in FIG. 3B), while the outer sides of channel structure regions 320 in WL direction can have a staircase structure (not shown in FIG. 3B). Thus, the top selective gates of channel structures 312 between two channel structure regions 320 in memory finger 344 on both side of WL TAC region 372 can be interconnected by using the staircase structure on the edges of the memory plane 110 of the 3D NAND device. Such deign can be suitable for zigzag word line decoder (X-DEC) routing.

Figure 3C:
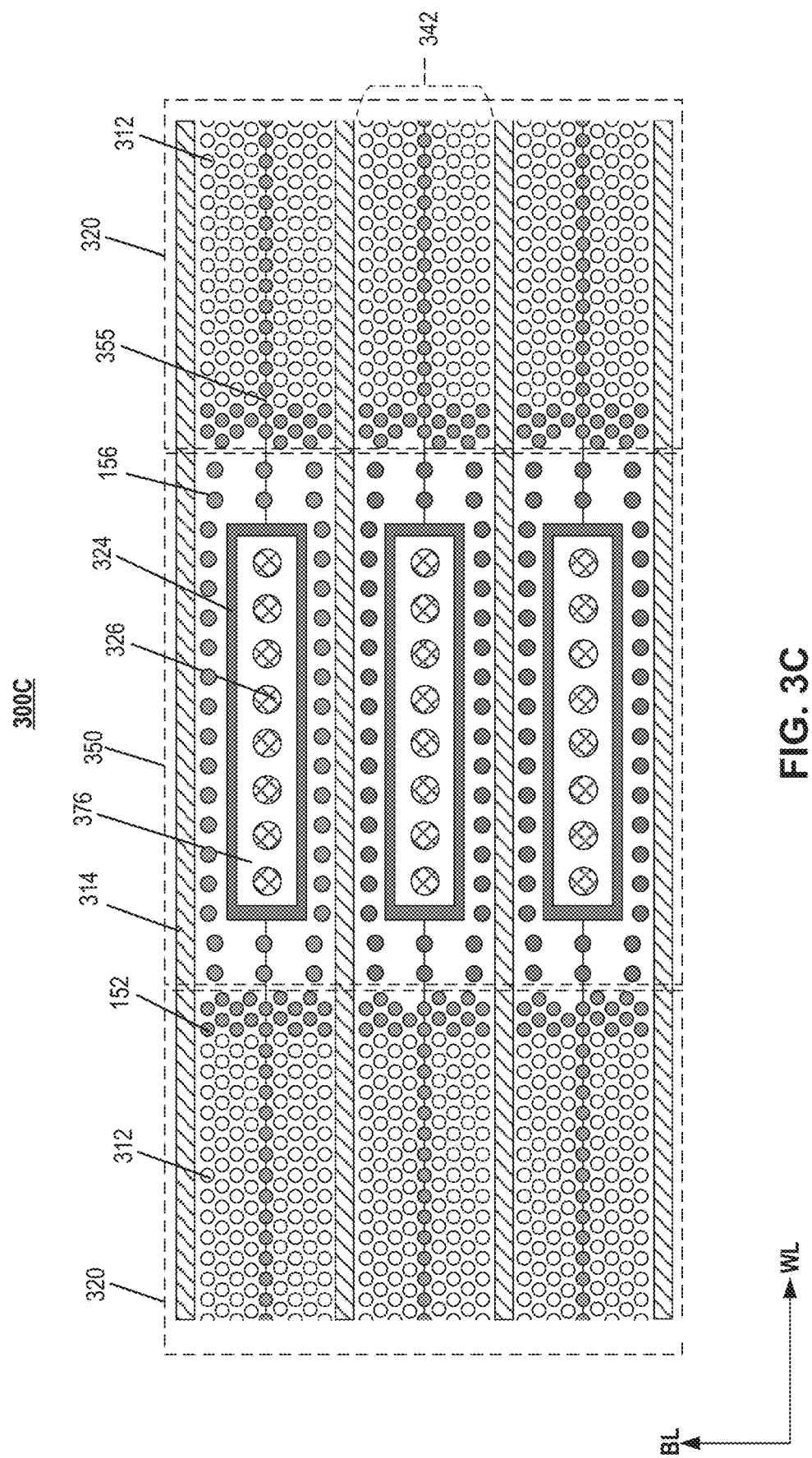

Referring to FIG. 3C, an enlarged plan view of the region 140 shown in FIG. 1 including other exemplary word line (WL) TAC regions of the 3D memory device is illustrated according to some alternative embodiments of the present disclosure. The region 300C of the 3D memory device (i.e., region 140 as shown in FIG. 1) can include channel structure regions 320, a dummy channel region 350 that encloses a plurality of word line (WL) TAC regions 376.

As shown in FIG. 3C, in some embodiments, a plurality of slit structures 314 each extending in WL direction can divide the 3D memory device into multiple memory fingers 342. A top select gate cut 355 can be disposed in the middle of each memory finger 342 to divide the top select gate (TSG) of the memory finger into two portions.

Channel structure regions 320 can include an array of channel structures 312, each including a plurality of stacked memory cells. Dummy channel region 350 is sandwiched by two channel structure regions 320 in WL direction. A plurality of WL TAC regions 376 arranged in a column along BL direction are enclosed by dummy channel region 350. Each WL TAC region 376 can be defined by a barrier structure 324. Multiple TACs 326 can be formed in each WL TAC region 376, which is enclosed laterally by barrier structure 324.

In some embodiment, a width of each WL TAC region 376 in BL direction can be less than a width of each memory finger 342. That is, barrier structure 324 of each WL TAC region 376 can be located between two neighboring slit structures 314. Since barrier structure 324 of each WL TAC region 376 does not complete block the conductive layers in dummy channel region 350, the top selective gates of channel structures 312 between two channel structure regions 320 in each memory finger 342 on both side of WL TAC region 376 can be interconnected by the top conductor layers in the alternating conductor/dielectric stack in dummy channel region 350.

In some embodiments, dummy channel structures 322 are formed outside WL TAC region 376 to provide mechanical support for the memory array structures. It is understood that dummy channel structures 322 can be formed in any regions outside WL TAC region 376, for example, in dummy channel region 350, and along the edges of channel structure regions 320 adjacent to dummy channel region 350. It is noted that, channel structures 312 and dummy channel structures 322 penetrate the alternating conductor/dielectric stack, while TACs 326 penetrate the alternating dielectric stack.

Accordingly, by disposing one WL TAC region 376 within each memory finger 342, the top conductor layers in the alternating conductor/dielectric stack may not be blocked by the WL TAC region 376. Thus, no additional structure is requested to further interconnect the top selective gates of channel structures 312 between two channel structure regions 320 in each memory finger 342 on both side of WL TAC region 376. Therefore, multiple WL TAC regions 376 can be arranged in each memory finger 342 along WL direction. That is, a memory 110 can include multiple memory blocks 115 in WL direction.

Figure 3D:
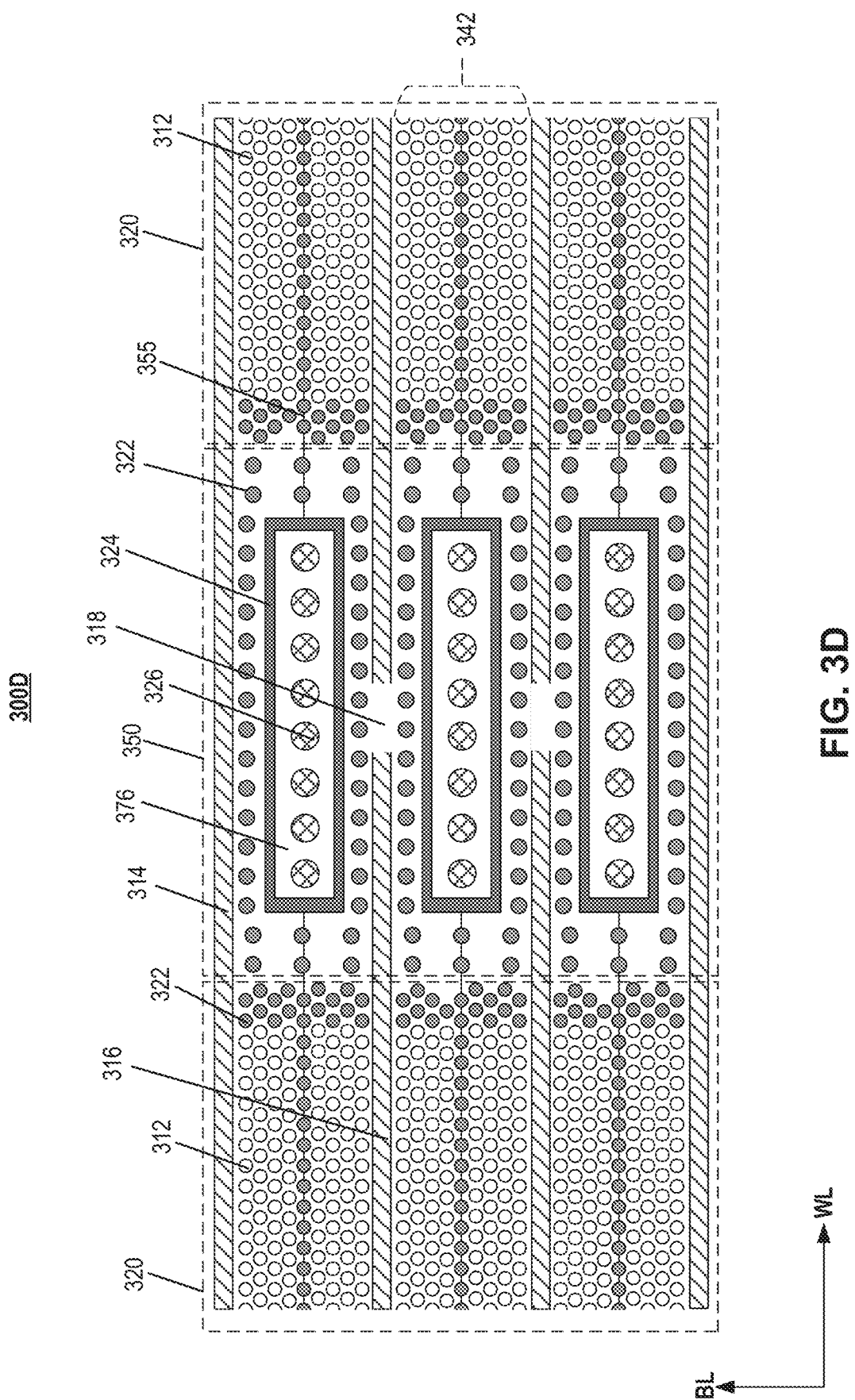

Referring to FIG. 3D, an enlarged plan view of the region 140 shown in FIG. 1 including other exemplary word line (WL) TAC regions of the 3D memory device is illustrated according to some alternative embodiments of the present disclosure. The region 300D of the 3D memory device (i.e., region 140 as shown in FIG. 1) can include channel structure regions 320, a dummy channel region 350 that encloses a plurality of word line (WL) TAC regions 376.

As shown in FIG. 3D, in some embodiments, a plurality of slit structures 314, 316 each extending in WL direction can divide the 3D memory device into multiple memory fingers 342. In some embodiments, slit structures 314 can extend in WL direction all the way in through two or more channel structure regions 320 and one or more dummy channel regions 350. At least one slit structure 316 can include a gap 318 in a dummy channel region 350, as shown in FIG. 3D. A top select gate cut 355 can be disposed in the middle of each memory finger 342 to divide the top select gate (TSG) of the memory finger into two portions.

Channel structure regions 320 can include an array of channel structures 312, each including a plurality of stacked memory cells. Dummy channel region 350 is sandwiched by two channel structure regions 320 in WL direction. A plurality of WL TAC regions 376 arranged in a column along BL direction are enclosed by dummy channel region 350. Each WL TAC region 376 can be defined by a barrier structure 324. Multiple TACs 326 can be formed in each WL TAC region 376, which is enclosed laterally by barrier structure 324.

In some embodiment, a width of each WL TAC region 376 in BL direction can be less than a width of each memory finger 342. That is, barrier structure 324 of each WL TAC region 376 can be located between two neighboring slit structures 314. Since barrier structure 324 of each WL TAC region 376 does not complete block the conductive layers in dummy channel region 350, the top selective gates of channel structures 312 between two channel structure regions 320 in each memory finger 342 on both side of WL TAC region 376 can be interconnected by the top conductor layers in the alternating conductor/dielectric stack in dummy channel region 350.

In some embodiments, dummy channel structures 322 are formed outside WL TAC region 376 to provide mechanical support for the memory array structures. It is understood that dummy channel structures 322 can be formed in any regions outside WL TAC region 376, for example, in dummy channel region 350, and along the edges of channel structure regions 320 adjacent to Dummy channel region 350. It is noted that, channel structures 312 and dummy channel structures 322 penetrate the alternating conductor/dielectric stack, while TACs 326 penetrate the alternating dielectric stack.

In some embodiments, one or more slit structure 316 can include a gap 318 in a dummy channel region 350. The word lines in neighboring memory fingers 342 can be interconnected by using conductive lines going through the gap 318. For example, as shown in FIG. 3D, the slit structures 314 that are at the edges of a memory block 115 can extend in WL direction all the way in through two or more channel structure regions 320 and one or more dummy channel regions 350, while slit structures 316 inside of each memory block 115 can include one or more gaps 318 in corresponding dummy channel regions 350 respectively. As such, all the top select gates and/or word lines in the same memory block 115 can be interconnected without additional structures.

Accordingly, by disposing WL TAC region 376 within memory finger 342 and providing gap 318 in slit structure 316, the top conductor layers in the alternating conductor/dielectric stack may not be blocked by the WL TAC region 376, and word lines in neighboring memory fingers 342 can be interconnected. Therefore, multiple WL TAC regions 376 can be arranged in each memory finger 342 along WL direction. That is, a memory 110 can include multiple memory blocks 115 in WL direction. Such structure can have a high integration level and a simply layout that can be easily fabricated.

Referring to FIG. 4A, an enlarged plan view of the region 150 shown in FIG. 1 including an exemplary staircase structure (SS) TAC region of the 3D memory device is illustrated according to some embodiments of the present disclosure. The region 400A of the 3D memory device (i.e., region 150 as shown in FIG. 1) can include channel structure regions 420, a staircase region 410, and a staircase structure (SS) TAC regions 482.

Channel structure region 420 can include an array of channel structures 412, each including a plurality of stacked memory cells. Staircase region 410 can include a staircase structure and an array of word line contacts 432 formed on the staircase structure. In some embodiments, SS TAC region 482 is in staircase region 410. SS TAC region 482 can be defined by a barrier structure 424 alone or in conjunction with an edge of staircase region 410 of the 3D memory device. Multiple TACs 426 can be formed in SS TAC region 482, which is enclosed laterally by at least barrier structure 424.

As shown in FIG. 4A, in some embodiments, a plurality of slit structures 414, 416 each extending in WL direction can divide the 3D memory device into multiple memory fingers 442, 444. In some embodiments, slit structures 414 can extend in WL direction into at least a portion of staircase region 410. At least some slit structures 416 can include one or more gaps 418 in staircase region 410. A top select gate cut 455 can be disposed in the middle of each memory finger 442, 444 to divide the top select gate (TSG) of the memory finger into two portions.

In some embodiments, one or more slit structure 416 can include a gap 418 in staircase region 410. Word line contacts 432 in neighboring memory fingers 442 can be interconnected by using conductive lines going through the gap 418. For example, as shown in FIG. 4A, the slit structures 414 that are at the edges of a memory block 115 can extend in WL direction all the way in through channel structure region 420 and staircase region 410, while slit structures 416 inside of each memory block 115 can include one or more gaps 418 in staircase region 410. As such, all word line contacts 432 in the same memory block 115 can be interconnected without additional structures.

It is noted that, a width of SS TAC region 482 in BL direction can be larger than a width of each memory finger 442, 444. That is, barrier structure 424 in BL direction can cross at least two neighboring slit structures 414. Since SS TAC region 482 occupies the area of a portion of staircase region 410 that corresponds to memory fingers 444 completely blocked by barrier structure 424, the staircase structure in SS TAC region 482 is used for forming TACs 426 rather than forming word line contacts 432 for memory fingers 444. Therefore, the staircase structure corresponding to memory fingers 444 on the other side of memory plane 110 (not shown in FIG. 4B) can be used to form word line contacts 432 rather than SS TAC region 482.

Accordingly, in some embodiments associated with such design of SS TAC region 482, SS TAC regions 482 on both sides of memory plane 110 do not overlap in WL direction. That is, one memory finger corresponds to at maximum one SS TAC region 482. Such deign can be suitable for zigzag word line decoder (X-DEC) routing. Further, in some embodiments associated with designs of SS TAC region 482 as well as WL TAC region 372 described above in connection with FIG. 3B, due to the same reason, SS TAC regions 482 and WL TAC regions 372 do not overlap in WL direction. That is, one memory finger corresponds to either one SS TAC region 482 or one WL TAC regions 372 at maximum.

Referring to FIG. 4B, an enlarged plan view of the region 150 shown in FIG. 1 including other exemplary staircase structure (SS) TAC regions of the 3D memory device is illustrated according to some alternative embodiments of the present disclosure. The region 400B of the 3D memory device (i.e., region 150 as shown in FIG. 1) can include channel structure regions 420, a staircase region 410, and a plurality of staircase structure (SS) TAC regions 484.

Channel structure region 420 can include an array of channel structures 412, each including a plurality of stacked memory cells. Staircase region 410 can include a staircase structure and an array of word line contacts 432 formed on the staircase structure. In some embodiments, SS TAC regions 484 are in staircase region 410. Each SS TAC regions 484 can be defined by a barrier structure 424 alone or in conjunction with an edge of staircase region 410 of the 3D memory device. Multiple TACs 426 can be formed in SS TAC region 482, which is enclosed laterally by at least barrier structure 424.

As shown in FIG. 4B, in some embodiments, a plurality of slit structures 414 each extending in WL direction in channel structure regions 420 can divide the 3D memory device into multiple memory fingers 442. A top select gate cut 455 can be disposed in the middle of each memory finger 442 to divide the top select gate (TSG) of the memory finger into two portions. In some embodiments, slit structures 414 can extend in WL direction into at least a portion of staircase region 410. In some embodiments, staircase region 410 can further include multiple slit structures 416 that are not aligned with slit structures 414 in WL direction. That is, distances between neighboring slit structures in staircase region 410 can be non-uniform. Some neighboring slit structure pairs can have a first distance that is larger than a second distance between other neighboring slit structure pairs.

In some embodiments, each SS TAC region 484 can be located between the neighboring slit structure pair that have the first distance. That is, a width of SS TAC region 484 in BL direction can be less than the first distance. As such, other than the space occupied by SS TAC region 484, staircase region 410 between such neighboring slit structure pair that have the first distance can have extra space to form word line contacts 432.

Figure 5:
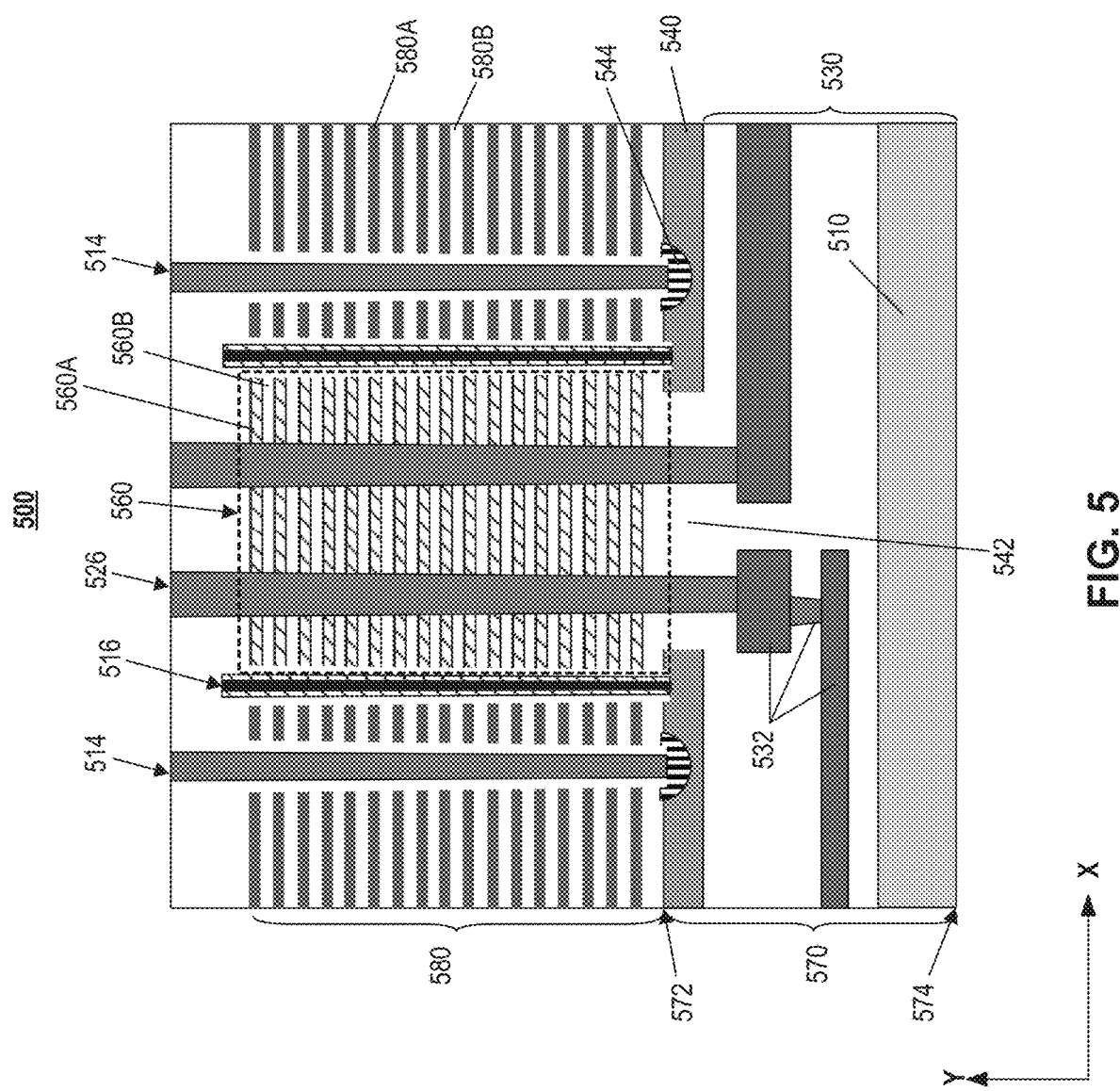
FIG. 5 illustrates a schematic cross-sectional view of an exemplary 3D memory device according to some embodiments of the present disclosure.

Referring to FIG. 5, a schematic cross-sectional view of an exemplary 3D memory device 500 is illustrated according to some embodiments of the present disclosure. 3D memory device 500 can be part of a non-monolithic 3D memory device, in which components (e.g., the peripheral device and array device) can be formed separately on different substrates. For example, 3D memory device 500 can be region 130, region 140, or region 150 described above in connection with FIG. 1.

As shown in FIG. 5, 3D memory device 500 can include a substrate 570 and an array device above the substrate 570. It is noted that X and Y axes are added in FIG. 5 to further illustrate the spatial relationship of the components in 3D memory device 500. Substrate 570 includes two lateral surfaces (e.g., a top surface 572 and a bottom surface 574) extending laterally in the X direction (the lateral direction, e.g., WL direction or BL direction).

As used herein, whether one component (e.g., a layer or a device) is "on," "above," or "below" another component (e.g., a layer or a device) of a semiconductor device (e.g., 3D memory device 500) is determined relative to the substrate of the semiconductor device (e.g., substrate 570) in the Y direction (the vertical direction) when the substrate is positioned in the lowest plane of the semiconductor device in the Y direction. The cross-sectional view of the 3D memory device 500 shown in FIG. 5 is along a plane in BL direction and Y direction. The same notion for describing spatial relationship is applied throughout the present disclosure.

Substrate 570 can be used for supporting the array device, and can include a circuit substrate 530 and an epitaxial substrate 540. Circuit substrate 530 can include a base substrate 510 and one or more peripheral circuits (not shown in FIG. 5) formed above base substrate 510. Base substrate 510 can include any suitable semiconductor material that can include silicon (e.g., monocrystalline silicon, polycrystalline silicon), silicon germanium (SiGe), gallium arsenide (GaAs), germanium (Ge), silicon on insulator (SOI), germanium on insulator (GOI), or any suitable combination thereof. In some embodiments, base substrate 510 is a thinned substrate (e.g., a semiconductor layer), which was thinned by grinding, wet/dry etching, chemical mechanical polishing (CMP), or any combination thereof.

The one or more peripheral circuits formed in circuit substrate 530 can include any suitable digital, analog, and/or mixed-signal peripheral circuits used for facilitating the operation of 3D memory device 500, such as page buffers, decoders, and latches (not shown in FIG. 5). In some embodiments, circuit substrate 530 can further include one or more interconnection structures 532 for electrically connecting the one or more peripheral circuits to the array device above the substrate 570. The one or more interconnection structures 532 can include any suitable conductive structures including, but not limited to, contacts, single-layer/multi-layer vias, conductive layer(s), plugs, etc.

Epitaxial substrate 540 can be formed on the circuit substrate 530 by using a deposition process including, but not limited to, chemical vapor deposition (CVD), physical vapor deposition (PVD), atomic layer deposition (ALD), or any combination thereof. Epitaxial substrate 540 can be a single layer substrate or a multi-layer substrate, for example, a monocrystalline single-layer substrate, a polycrystalline silicon (polysilicon) single-layer substrate, a polysilicon and metal multi-layer substrate, etc. Further, one or more openings 542 can be formed in regions of epitaxial substrate 540 that correspond to one or more through array contact (TAC) structures of the array device. A plurality of TACs 526 can go through one or more openings 542 to electronically connect with one or more interconnection structures 532 in circuit substrate 530.

In some embodiments, 3D memory device 500 is a NAND Flash memory device in which memory cells are provided in the form of an array of channel structures (not shown in FIG. 5) extending in Y direction above substrate 570. The array device can include a plurality of channel structures that extend through an alternating conductor/dielectric stack 580 including a plurality of conductor layer 580A and dielectric layer 580B pairs. The number of the conductor/dielectric layer pairs in alternating conductor/dielectric stack 580 (e.g., 32, 64, or 96) can set the number of memory cells in 3D memory device 500.

Conductor layers 580A and dielectric layers 580B in alternating conductor/dielectric stack 580 alternate in Y direction. In other words, except the ones at the top or bottom of alternating conductor/dielectric stack 580, each conductor layer 580A can be adjoined by two dielectric layers 580B on both sides, and each dielectric layer 580B can be adjoined by two conductor layers 580A on both sides. Conductor layers 580A can each have the same thickness or have different thicknesses. Similarly, dielectric layers 580B can each have the same thickness or have different thicknesses. Conductor layers 580A can include conductor materials including, but not limited to, tungsten (W), cobalt (Co), copper (Cu), aluminum (Al), polycrystalline silicon (polysilicon), doped silicon, silicides, or any combination thereof. Dielectric layers 580B can include dielectric materials including, but not limited to, silicon oxide, silicon nitride, silicon oxynitride, or any combination thereof. In some embodiments, conductor layers 580A include metal layers, such as W, and dielectric layers 580B include silicon oxide.

In some embodiments, the array device further includes slit structures 514. Each slit structure 514 can extend in the Y direction through alternating conductor/dielectric stack 580. Slit structure 514 can also extend laterally (i.e., substantially parallel to the substrate) to separate alternating conductor/dielectric stack 580 into multiple blocks. Slit structure 514 can include a slit filled with conductor materials including, but not limited to, W, Co, Cu, Al, silicides, or any combination thereof. Slit structure 514 can further include a dielectric layer with any suitable dielectric materials between the filled conductor materials and alternating conductor/dielectric stack 580 to electrically insulate the filled conductor materials from surrounding conductor layers 580A in alternating conductor/dielectric stack 580. As a result, slit structures 514 can separate 3D memory device 500 into multiple memory fingers (e.g., as shown in FIGS. 2, 3A-3D, 4A-4B in the plan view).

In some embodiments, slit structure 514 functions as the source contact for channel structures in the same memory finger that share the same array common source. Slit structure 514 can thus be referred to as a "common source contact" of multiple channel structures. In some embodiments, epitaxial substrate 540 includes a doped region 544 (including p-type or n-type dopants at a desired doping level), and the lower end of slit structure 514 is in contact with doped region 544 of epitaxial substrate 540.

In some embodiments, an alternating dielectric stack 560 can be located in a region that is surrounded laterally by a barrier structure 516 on epitaxial substrate 540. Alternating dielectric stack 560 can include a plurality of dielectric layer pairs. For example, alternating dielectric stack 560 is formed by an alternating stack of a first dielectric layer 560A and a second dielectric layer 560B that is different from first dielectric layer 560A. In some embodiments, first dielectric layer 560A includes silicon nitride and second dielectric layer 560B includes silicon oxide. Second dielectric layers 560B in alternating dielectric stack 560 can be the same as dielectric layers 580B in alternating conductor/dielectric stack 580. In some embodiments, the number of dielectric layer pairs in alternating dielectric stack 560 is the same as the number of conductor/dielectric layer pairs in alternating conductor/dielectric stack 580.

In some embodiments, barrier structure 516 extending in the Y direction to separate laterally alternating conductor/ dielectric stack 580 and alternating dielectric stack 560. That is, barrier structure 516 can become the boundary between alternating conductor/dielectric stack 580 and alternating dielectric stack 560. Alternating dielectric stack 560 can be enclosed laterally by at least barrier structure 516. In some embodiments, barrier structure 516 is in a closed shape (e.g., a rectangle, a square, a circle, etc.) in the plan view to completely enclose alternating dielectric stack 560. For example, as shown in FIGS. 3A-3D, barrier structures 324 are in a rectangle shape in the plan view to completely enclose the alternating dielectric stack in WL TAC regions 372, 376. In some embodiments, barrier structure 516 is not in a closed shape in the plan view, but can enclose alternating dielectric stack 560 in conjunction with one or more edges of array device. For example, as shown in FIGS. 4A and 4B, barrier structure 424, in conjunction with the edge(s) of the 3D memory device, encloses the alternating dielectric stack in SS TAC regions 482, 484.

As shown in FIG. 5, 3D memory device 500 further includes a plurality of TACs 526 each extending in Y direction through alternating dielectric stack 560. TACs 526 can be formed only inside the area enclosed laterally by at least barrier structure 516, which includes a plurality of dielectric layer pairs. That is, TACs 526 can extend vertically through dielectric layers (e.g., first dielectric layers 560S and second dielectric layers 560B), but not through any conductor layers (e.g., conductor layers 580A). Each TAC 526 can extend through the entire thickness of alternating dielectric stack 560, (e.g., all the dielectric layer pairs in Y direction). In some embodiments, TAC 526 further penetrate epitaxial substrate 540 through opening 542 and electrically contact interconnection structure 532.

TACs 526 can carry electrical signals from and/or to 3D memory device 500, such as part of the power bus, with shorten interconnect routing. In some embodiments, TACs 526 can provide electrical connections between the array device and the peripheral devices (not shown in FIG. 5) through one or more interconnection structure 532. TACs 526 can also provide mechanical support to alternating dielectric stack 560. Each TAC 526 can include a vertical opening through alternating dielectric stack 560 and that is filled with conductor materials, including, but not limited to, W, Co, Cu, Al, doped silicon, silicides, or any combination thereof. In some embodiments, as TACs 526 are formed in alternating dielectric stack 560 (surrounding by dielectric layers), an additional dielectric layer between TAC 526 and alternating dielectric stack 560 is not needed for insulation purposes.

Figure 6:
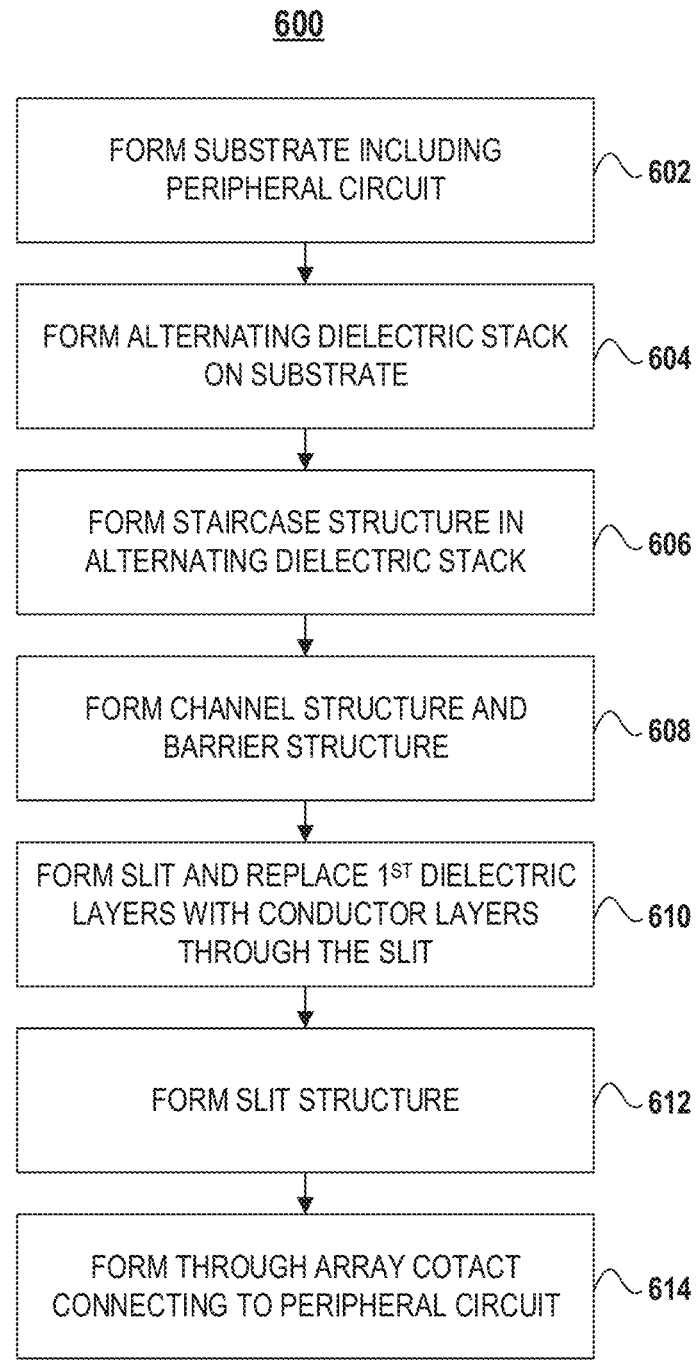
FIG. 6 is a flowchart of an exemplary method for forming a 3D memory device, according to some embodiments of the present disclosure.

Referring to FIG. 6, a schematic flowchart of an exemplary method 600 for forming a 3D memory device is illustrated according to some embodiments of the present disclosure. It should be understood that the operations shown in method 600 are not exhaustive and that other operations can be performed as well before, after, or between any of the illustrated operations.

Referring to FIG. 6, method 600 starts at operation 602, in which a substrate is formed. In some embodiments, forming the substrate can including forming a base substrate, forming at least one peripheral circuit on the substrate, forming at least one interconnection structure electronically contacting with the at least one peripheral circuit, and forming an epitaxial substrate on the at least one peripheral circuit.

The base substrate can be formed by using any suitable semiconductor material that can include silicon (e.g., monocrystalline silicon, polycrystalline silicon), silicon germanium (SiGe), gallium arsenide (GaAs), germanium (Ge), silicon on insulator (SOI), germanium on insulator (GOI), or any suitable combination thereof. In some embodiments, forming the base substrate includes a thinning process including grinding, wet/dry etching, chemical mechanical polishing (CMP), or any combination thereof.

The one or more peripheral circuits can include any suitable digital, analog, and/or mixed-signal peripheral circuits including, but not limited to, page buffers, decoders, and latches. In some embodiments, the one or more interconnection structures can include any suitable conductive structures including, but not limited to, contacts, single-layer/multi-layer vias, conductive layer(s), plugs, etc.

Epitaxial substrate can be formed above the one or more peripheral circuits by using a deposition process including, but not limited to, chemical vapor deposition (CVD), physical vapor deposition (PVD), atomic layer deposition (ALD), or any combination thereof. Epitaxial substrate can be a single layer substrate or a multi-layer substrate, for example, a monocrystalline single-layer substrate, a polycrystalline silicon (polysilicon) single-layer substrate, a polysilicon and metal multi-layer substrate, etc.

In some embodiments, forming the epitaxial substrate further includes forming one or more openings such that at least part of the one or more interconnection structures are exposed by the one or more openings. The one or more openings can corresponding to one or more through array contact TAC structures (e.g., word line (WL) TAC structure as shown in FIG. 2, bit line (BL) TAC structures as shown in FIGS. 3A-3D, and staircase structure (SS) TAC structures as shown in FIGS. 4A-4B) formed in subsequence processes. The one or more openings can be filled with dielectric materials.

Method 600 proceeds to operation 604, in which an alternating dielectric stack is formed on the substrate. In some embodiments, a plurality of first dielectric layer and second dielectric layer pairs can be formed on substrate to form alternating dielectric stack. In some embodiments, each dielectric layer pair includes a layer of silicon nitride and a layer of silicon oxide. Alternating dielectric stack can be formed by one or more thin film deposition processes including, but not limited to, CVD, PVD, ALD, or any combination thereof Method 600 proceeds to operation 606, in which a staircase structure is formed at one or more edges of the alternating dielectric stack. In some embodiments, a trim-etch process can be performed on at least one side (in the lateral direction) of alternating dielectric stack to form the staircase structure with multiple levels. Each level can include one or more dielectric layer pairs with alternating first dielectric layer and second dielectric layer.

Method 600 proceeds to operation 608, a plurality of channel structures and one or more barrier structures are formed. Each channel structure and each barrier structure can extend vertically through the alternating dielectric stack.

In some embodiments, fabrication processes to form channel structure include forming a channel hole that extends vertically through alternating dielectric stack by, for example, wet etching and/or dry etching. In some embodiments, fabrication processes to form channel structure further include forming semiconductor channel and memory film between semiconductor channel and the dielectric layer pairs in alternating dielectric stack. Semiconductor channel can include semiconductor materials, such as polysilicon. Memory film can be a composite dielectric layer, such as a combination of a tunneling layer, a storage layer, and a blocking layer.

The tunneling layer can include dielectric materials including, but not limited to, silicon oxide, silicon nitride, silicon oxynitride, or any combination thereof. Electrons or holes from the semiconductor channel can tunnel to a storage layer through the tunneling layer. The storage layer can include materials for storing charge for memory operation. The storage layer materials include, but are not limited to, silicon nitride, silicon oxynitride, a combination of silicon oxide and silicon nitride, or any combination thereof. The blocking layer can include dielectric materials including, but not limited to, silicon oxide or a combination of silicon oxide/silicon nitride/silicon oxide (ONO). The blocking layer can further include a high-k dielectric layer, such as an aluminum oxide (Al2O3) layer. Semiconductor channel and memory film can be formed by one or more thin film deposition processes, such as ALD, CVD, PVD, any other suitable processes, or any combination thereof In some embodiments, fabrication processes to form barrier structure are similarly and simultaneously performed as the fabrication processes to form channel structure, thereby reducing fabrication complexity and cost. In some other embodiments, channel structure and barrier structure are formed in different fabrication steps so that barrier structure can be filled with materials different from the materials filling channel structure.

In some embodiments, fabrication processes to form a barrier structure include forming a trench that extends vertically through alternating dielectric stack by, for example, wet etching and/or dry etching. After the trench is formed through alternating dielectric stack, one or more thin film deposition processes can be performed to fill the trench with dielectric materials including, but not limited to, silicon oxide, silicon nitride, silicon oxynitride, silicon oxide/silicon nitride/silicon oxide (ONO), aluminum oxide (Al2O3), etc., or any combination thereof.

By forming the one or more barrier structures, alternating dielectric stack can be separated into two types of regions: one or more inside regions each enclosed laterally by at least a barrier structure (in conjunction with the edge(s) of alternating dielectric stack in some embodiments) and an outside region in which channel structures and/or word line contacts can be formed. It is note that, each inside region corresponds to an opening in the epitaxial substrate.

In some embodiments, at least one inside region can be used to form a BL TAC structure as described above in connection with FIG. 2. As such, the barrier structure enclosing such inside region can include two parallel barrier walls that extend along WL direction.

In some embodiments, at least one inside region can be used to form a BL TAC structure as described above in connection with FIGS. 3A or 3B. As such, the barrier structure enclosing such inside region can have a rectangular shape. A width of the barrier structure in BL direction can be larger than a distance between two neighboring slit structures formed in subsequent processes.

In some embodiments, at least one inside region can be used to form a BL TAC structure as described above in connection with FIGS. 3C or 3D. As such, the barrier structure enclosing such inside region can have a rectangular shape. A width of the barrier structure in BL direction can be less than a distance between two neighboring slit structures formed in subsequent processes.

In some embodiments, at least one inside region can be used to form a SS TAC structure as described above in connection with FIG. 4A. As such, the barrier structure for separating such inside region can have a rectangular shape with one open edge facing the edge of the staircase structure. A width of the barrier structure in BL direction can be larger than a distance between two neighboring slit structures formed in subsequent processes.

In some embodiments, at least one inside region can be used to form a SS TAC structure as described above in connection with FIG. 4B. As such, the barrier structure for separating such inside region can have a rectangular shape with one open edge facing the edge of the staircase structure. A width of the barrier structure in BL direction can be less than a maximum distance between two neighboring slit structures formed in staircase region in subsequent processes.

In some embodiments, dummy channel structures can be formed simultaneously with channel structures. The dummy channel structures can extend vertically through the alternating layer stack and can be filled with the same materials as those in channel structures. Different from channel structures, contacts are not formed on the dummy channel structures to provide electrical connections with other components of the 3D memory device. Thus, the dummy channel structures cannot be used for forming memory cells in the 3D memory device.

Method 600 proceeds to operation 610, in which a plurality of slits are formed, and first dielectric layers in a portion of the alternating dielectric stack are replaced with conductor layers through the plurality of slits. For example, multiple parallel slit extending in WL direction can be first formed by wet etching and/or dry etching of dielectrics (e.g., silicon oxide and silicon nitride) through alternating dielectric stack in the outside area. In some embodiments, doped regions are then formed in the epitaxial substrate under each slit by, for example, ion implantation and/or thermal diffusion through the slits. It is understood that doped regions can be formed in an earlier fabrication stage, for example, prior to the formation of the slits, according to some embodiments.

In some embodiments, the formed slits are used for the gate replacement process (also known as the "word line replacement" process) that replaces, in the outside area of alternating dielectric stack, first dielectric layers (e.g., silicon nitride) with conductor layers (e.g., W). It is noted that, the gate replacement occurs only in the outside area of alternating dielectric stack, but not in the inside area, due to the formation of barrier structure. Barrier structure can prevent the etching of first dielectric layers (e.g., silicon nitride) in the inside area of alternating dielectric stack because barrier structure is filled materials that cannot be etched by the etching step of the gate replacement process.

As a result, after the gate replacement process, alternating dielectric stack in the outside region becomes alternating conductor/dielectric stack. The replacement of first dielectric layers with conductor layers can be performed by wet etching first dielectric layers (e.g., silicon nitride) selective to second dielectric layers (e.g., silicon oxide) and filling the structure with conductor layers (e.g., W). Conductor layers can be filled by PVD, CVD, ALD, any other suitable process, or any combination thereof. Conductor layers can include conductor materials including, but not limited to, W, Co, Cu, Al, polysilicon, silicides, or any combination thereof Method 600 proceeds to operation 612, in which slit structures are formed by filling (e.g., depositing) conductor materials into the slits by PVD, CVD, ALD, any other suitable process, or any combination thereof. Slit structures can include conductor materials including, but not limited to, W, Co, Cu, Al, polysilicon, silicides, or any combination thereof. In some embodiments, a dielectric layer (e.g., a silicon oxide layer) is formed first between the conductor materials of slit structure and conductor layers surrounding slit structure in alternating conductor/dielectric stack for insulation purposes. The lower end of slit structure can be in contact with doped region.

Method 600 proceeds to operation 614, in which a plurality of TACs are formed through alternating dielectric stack. TACs can be formed in the one or more inside regions by first etching vertical openings (e.g., by wet etching and/or dry etching), followed by filling the openings with conductor materials using ALD, CVD, PVD, any other suitable processes, or any combination thereof. The conductor materials used for filling the local contacts can include, but are not limited to, W, Co, Cu, Al, polysilicon, silicides, or any combination thereof. In some embodiments, other conductor materials are also used to fill the openings to function as a barrier layer, an adhesion layer, and/or a seed layer.

TACs can be formed by etching through the entire thickness of alternating dielectric stack and the dielectric layer formed in the opening(s) in the epitaxial substrate. Because alternating dielectric stack includes alternating layers of dielectrics, such as silicon oxide and silicon nitride, the openings of TACs can be formed by deep etching of dielectric materials (e.g., by deep reactive-ion etching (DRIE) process or any other suitable anisotropic etch process). In some embodiments, TACs penetrate the epitaxial substrate through openings of the epitaxial substrate. The lower end of TACs can be in contact with interconnection structures in the substrate. As such, TACs can be electrically connected with peripheral devices formed in the substrate.

In some embodiments, although TACs are formed after the gate replacement, by reserving an area of alternating dielectric stack that is not affected by the gate replacement process (not turned into alternating conductor/dielectric stack), TACs are still formed through dielectric layers (without passing through any conductor layers), which simplifies the fabrication process and reduces the cost.

Various embodiments in accordance with the present disclosure provide a 3D memory device with through array contact structures for a memory array. The through array contact structures disclosed herein can include TACs for providing vertical interconnects between the stacked array device and peripheral device (e.g., for power bus and metal routing), thereby reducing metal levels and shrinking die size. In some embodiments, the TACs in the through array contact structures disclosed herein are formed through a stack of alternating dielectric layers, which can be more easily etched to form through holes therein compared with a stack of alternating conductor and dielectric layers, thereby reducing the process complexity and manufacturing cost.

Accordingly, one aspect of the present discloses a three-dimensional (3D) NAND memory device including a substrate including at least one peripheral circuit, and an alternating layer stack disposed on the substrate. The alternating layer stack includes a first region including an alternating dielectric stack including a plurality of dielectric layer pairs, a second region including an alternating conductor/dielectric stack including a plurality of conductor/dielectric layer pairs, and a third region including staircase structures on edges of the alternating conductor/dielectric layer stack in a word line direction. The memory device further includes a barrier structure extending vertically through the alternating layer stack to laterally separate the first region from the second region or the third region, a plurality of channel structures and a plurality of slit structures each extending vertically through the alternating conductor/dielectric stack, and a plurality of through array contacts in the first region each extending vertically through the alternating dielectric stack. At least one of the plurality of through array contacts is electrically connected with the at least one peripheral circuit.

Another aspect of the present disclosure provides a method for forming a three-dimensional (3D) NAND memory device. The method includes forming a substrate including at least one peripheral circuit; forming, on the substrate, an alternating dielectric stack including a plurality of dielectric layer pairs, each of the plurality of dielectric layer pairs including a first dielectric layer and a second dielectric layer different from the first dielectric layer; forming a staircase structure at an edge of the alternating dielectric stack; forming a plurality of channel structures and at least one barrier structure each extending vertically through the alternating dielectric stack. The at least one barrier structure separates the alternating dielectric stack into at least one first region enclosed laterally by at least the barrier structure, and a second region. The method further comprises forming a plurality of slits, and replacing, through the slits, first dielectric layers in the second portion of the alternating dielectric stack with conductor layers to form an alternating conductor/dielectric stack including a plurality of conductor/dielectric layer pairs; depositing a conductive material into the slits to form a plurality of slit structures; and forming a plurality of through array contacts in the first region, each through array contact extending vertically through the alternating dielectric stack, to electrically connect at least one of the plurality of through array contacts to the at least one peripheral circuit.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a first stack comprising first and second dielectric layers arranged alternately in a vertical direction;

a second stack comprising conductor layers and third dielectric layers arranged alternately in the vertical direction;

a staircase region extending across the first stack and the second stack, the staircase region comprising a staircase structure which defines a slope having an upper edge and a lower edge, the slope of the staircase structure in the vertical direction;

a contact penetrating the first stack in the staircase region; and a barrier structure separating the first stack from the second stack along the upper edge and terminating at the lower edge of the staircase region without completely enclosing the first stack in the staircase region.

2. The memory device of claim 1, further comprising:
a channel region comprising channel structures penetrating the second stack in the vertical direction, the channel region and the staircase region arranged in a lateral direction perpendicular to the vertical direction, wherein the upper edge is closer to the channel region than the lower edge.

3. The memory device of claim 1, wherein:
the barrier structure comprises a first sub-barrier structure and two parallel second sub-barrier structures, the two parallel second sub-barrier structures extending along a lateral direction perpendicular to the vertical direction, and the first stack lying between the two parallel second sub-barrier structures;
ends of the two parallel second sub-barrier structures are connected by the first sub-barrier structure;
other ends of the two parallel second sub-barrier structures are disconnected by a wall structure; and
the wall structure is different from the barrier structure.

4. The memory device of claim 3, further comprising:
a contact region comprising the contact, the contact region in conjunction with the barrier structure and the wall structure, wherein
the wall structure is closer to the lower edge than the upper edge.

5. The memory device of claim 1, further comprising:
a word line contact on the staircase structure of the staircase region.

6. The memory device of claim 3, further comprising:
dummy channel structures extending through the second stack, wherein the dummy channel structures are located on both sides of the two parallel second sub-barrier structures along a bit line direction, and the bit line direction is perpendicular to the vertical direction.

7. The memory device of claim 1, wherein:
the contact is connected with a peripheral circuit.

8. The memory device of claim 1, wherein:
the first dielectric layers and the second dielectric layers comprise different material;
the first dielectric layers and the third dielectric layers comprise same material.

9. The memory device of claim 1, further comprising:
a first substrate comprising an interconnection structure;
a second substrate disposed on the first substrate,
wherein the contact extends through the second substrate and connects to the interconnection structure.

10. The memory device of claim 1, wherein the barrier structure comprises silicon oxide.

11. The memory device of claim 1, wherein:
the first dielectric layers comprise a silicon oxide layer;
the second dielectric layers comprise a silicon nitride layer; the conductor layers comprise a metal layer; and
the third dielectric layers comprise a silicon oxide layer.

12. The memory device of claim 2, further comprising:
slit structures extending through the second stack along the lateral direction, wherein
the slit structures divide the second stack into memory fingers.

13. The memory device of claim 12, wherein:
the slit structures comprise a conductive material.

14. The memory device of claim 12, further comprising:
first slit structures and second slit structures, extending through the second stack along the lateral direction,
wherein the first slit structures are not aligned with the second slit structures in the lateral direction.

15. The memory device of claim 14, wherein:
at least one of the second slit structures lies between two neighboring first slit structures; and
the barrier structure lies between the two neighboring first slit structures.

16. A three-dimensional (3D) memory device, comprising:
a first stack comprising first and second dielectric layers arranged alternately in a vertical direction;
a second stack comprising conductor layers and third dielectric layers arranged alternately in the vertical direction;
a contact penetrating the first stack in the vertical direction;
a barrier structure separates the first stack and the second stack; and
slit structures extending through the second stack along a lateral direction that is perpendicular to the vertical, wherein the slit structures divide the second stack into memory fingers, and the slit structures comprise a conductive material.

17. The memory device of claim 16, wherein:
the slit structures comprise first slit structures and second slit structures, the first slit structures and the second slit structures extending vertically through the second stack and laterally along the lateral direction;
the first slit structures are not aligned with the second slit structures in the lateral direction;
at least one of the second slit structures lies between two neighboring first slit structures; and
the barrier structure lies between the two neighboring first slit structures.

18. The memory device of claim 16, wherein:
the contact is connected with a peripheral circuit.

19. The memory device of claim 16, wherein:
the first stack and the second stack are separated by two parallel second sub-barrier structures extending along the lateral direction.

20. The memory device of claim 16, further comprising:
a channel region and a staircase region arranged in the lateral direction; and
channel structures located in the channel region and extending through the second stack in the vertical direction, wherein
the first stack and the barrier structure are located in the staircase region.

* * * * *